(12) United States Patent
Briand

(10) Patent No.: US 6,355,574 B1
(45) Date of Patent: Mar. 12, 2002

(54) METHOD AND DEVICE FOR TREATING A SEMICONDUCTOR SURFACE

(75) Inventor: Jean-Pierre Briand, Antony (FR)

(73) Assignee: Universite Pierre et Marie Curie, Paris Cedex (FR)

( * ) Notice: Subject to any disclaimer, the term of this patent is extended or adjusted under 35 U.S.C. 154(b) by 0 days.

(21) Appl. No.: 09/331,953
(22) PCT Filed: Dec. 29, 1997
(86) PCT No.: PCT/FR97/02441
§ 371 Date: Oct. 18, 1999
§ 102(e) Date: Oct. 18, 1999
(87) PCT Pub. No.: WO98/29901
PCT Pub. Date: Jul. 9, 1998
(51) Int. Cl.[7] .................................. H01L 21/302
(52) U.S. Cl. ................... 438/710; 438/712; 438/719
(58) Field of Search .................. 438/700, 676, 438/677, 974, 706, 719, 745, 712

(56) References Cited

U.S. PATENT DOCUMENTS 5,010,040 A * 4/1991 Vayman ........................ 438/98
5,231,055 A * 7/1993 Smith ........................... 437/192
5,308,791 A * 5/1994 Horiike et al. ............... 438/758
5,580,615 A * 12/1996 Itoh et al. ..................... 438/676
5,604,153 A * 2/1997 Tsubouchi et al. ........... 438/676
5,861,233 A * 1/1999 Sekine et al. ................ 438/700

* cited by examiner

Primary Examiner—Benjamin L. Utech
Assistant Examiner—Duy-Vu Deo
(74) Attorney, Agent, or Firm—Young & Thompson

(57) ABSTRACT

The invention concerns a method for treating a surface (2) of a semiconductor (1B) and a corresponding treating device. The surface is made by first molecules of the semiconductor having external bonds saturated with hydrogen. The method consists in sending a beam (30) of ions highly charged and with low energy towards the surface, and applying thereto a deceleration voltage $U_2$ in the proximity of the surface. In this way, the ions extract without making contact the electrons of the first molecules, releasing the hydrogen atoms saturating the corresponding external bonds. Then a product saturating the pendant external bonds is sent so as to form second molecules of an insulating compound. The invention is useful for surface cleaning, etching and nano-manufacturing.

14 Claims, 2 Drawing Sheets

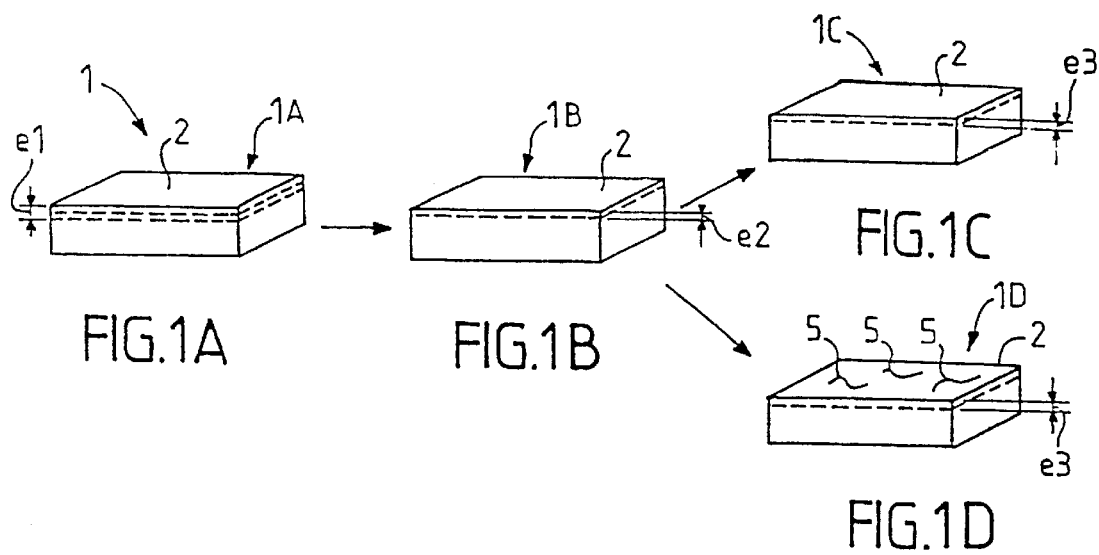
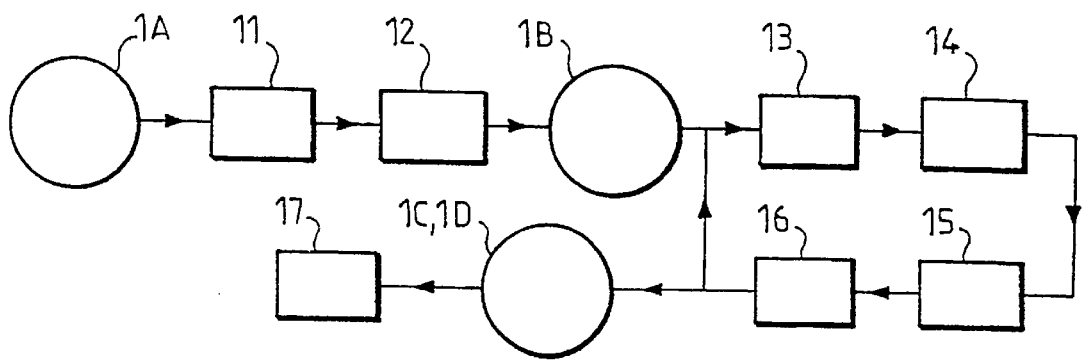
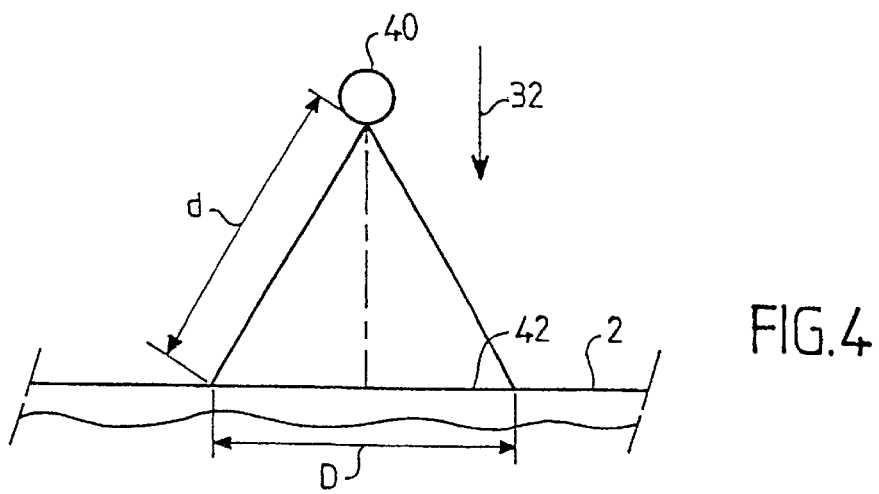

METHOD AND DEVICE FOR TREATING A SEMICONDUCTOR SURFACE

This invention relates to surface treatment of semiconductors and relates to a method and a device for treating a surface of a semiconductor as well as a semiconductor. It finds applications in the field of surface cleaning, etching and nano-manufacturing.

Techniques enabling to prepare silicon wafers with perfectly passivated and extremely plane surface, made of hydrogenated silicon, whereby hydrogen forms a mono-atomic layer on top of silicon, are known. Such a preparation can be made from a silicon wafer, cut according to the standard practice of the man skilled in the art and exposed to open air. We know that surrounding oxygen covers immediately the surfaces of the wafer in order to oxide silicon while forming $SiO_2$ molecules over a typical thickness of 5–6 atomic layers corresponding to approx. 20 Angstrom. Thus, according to a method rather well known by the specialists and produced by BELL TELEPHONIE Co., the surface-oxidised silicon wafer is dipped into two successive baths, whereas the first one contains hydrofluoric acid and the second one hydrofluoric acid as well as ammonium ions. Treated surfaces are thus etched and covered with a single hydrogen layer. The resulting wafer is kept under vacuum, protected from external contaminations.

Such techniques enable therefore to obtain extremely clean surfaces, but with an external hydrogen-passivated layer. Still, it often proves useful to have one or several external insulating layers, notably made of $SiO_2$. For instance, a silicon wafer covered with an $SiO_2$ layer can be used for manufacturing an MOS-type transistor, by application of an additional metallic layer.

Another problem associated with surface treatment of semiconductors relates to the etching of these surfaces (lithography). Surface marking at industrial level is currently performed by a fraction of a micron, as regards the sizes of the marks as well as their positions. It has been suggested to send highly charged ions to a mica or graphite surface, in order to create permanent punctual defects using contact and highly energetic collisions. These defects build blisters of a few nanometers in size, distributed in such a way as to change the surface topography.

Major shortcomings of this etching method are that these methods only modify the surface topography.

The document E-A-0.567.985 discloses a method for manufacturing a thin film. This method comprises a first step consisting in selective irradiation of a substrate whose surface has been treated to contain hydrogen atoms so as to form an irradiated zone and a non-irradiated zone on this surface. The method comprises a second step consisting in selective formation of a thin film on the non-irradiated zone. As shown by this document, the disclosed method enables drawing up on a semiconductor substrate thin aluminium films whose thickness is liable to be as small as 100 nm.

The document patent Abstract of Japan, vol. 17, No. 649 (E 1468), JP-A-5.211.120 describes a device enabling to form a sample of thin film while adjusting the kinetic energy of an ionic beam originating from a liquid source of metallic ions and sent toward a target. The formation of the sample at the surface of a substrate is obtained by irradiating the substrate using the ionic beam.

The document Applied Physics Letters, vol. 56, No. 20 (May 14, 1990), pages 2001 to 2003, J.A. DAGATA et al., mentions chemical modification of passivated silicon surfaces with hydrogen, using an STM-type tunnel effect microscope. This document mentions a 100 nm-line resolution.

This invention relates to a method for treating a surface of a silicon wafer, enabling to make this surface extremely clean and plane, and made by one or several $SiO_2$ monolayers.

More generally, the invention relates to a method for treating a semiconductor surface, enabling to make this surface extremely clean and well delineated, and made by an isolating compound extending over one or several molecular layers.

The aim of the invention is also to provide a method for treating a semiconductor surface, enabling to etch the said surface by approx. one nanometer.

The invention relates to such methods that can be implemented easily, enable real-time control of the surface preparation and make later control very simple as well as extremely accurate.

Another aim of the invention is a device for treating a semiconductor surface, enabling to clean this surface to make it extremely clean and well delineated, and made by an insulating compound over one or several molecular layers.

The invention also relates to a device for treating a semiconductor surface enabling to etch this surface by approx. one nanometer.

The invention relates to such treating devices that can be performed and implemented quite easily, which enable real-time control of the surface preparation and later control of the surface condition, simply as well as extremely accurately.

The invention also relates to a semiconductor with considerable information storage capacities, preferably by a factor at least equal to 10,000 times those of existing semiconductors.

In this view, the invention relates to a method for treating a semiconductor surface, whereby this surface is made by first molecules of the semiconductor with external bonds and the said bonds are saturated with hydrogen atoms.

The method comprises the steps of:
generating positive ions each having at least three positive charges, with low energy, with respect to the MeV,
sending under vacuum a beam made of these ions toward at least one zone of the surface, whereas these zones cover a determined portion of the surface;
applying to the beam a deceleration voltage close to the surface, in order to give the ions of the beam a controlled average speed, whereas the ions extract electrons of the first molecules of these zones without contacting the surface, so that these first molecules lose their hydrogen atoms and that the corresponding external bonds become pendant, and
sending toward these zones a product saturating the pendant external bonds in order to form second molecules of an insulating compound.

By 'surface', we mean a superficial part of the semiconductor, generally cut approximately along a crystallographic plane.

The surface is advantageously plane, in order to serve notably as a substrate for growing layers or for etching. In embodiment variations, the surface is curved.

By 'highly charged' positive ions, we mean ions with at least three positive charges and preferably at least fifteen positive charges. Their energy is said to be 'low' with respect to that of ions obtained using a particle accelerator, whereas this energy is approx. one MeV or one GeV. The low energy of the ions is thus smaller than a few tens keV.

The 'vacuum' under which the beam of ions is sent may correspond to relatively high pressure, for instance in the order to $10^{-9}$ Pa. It can also be ultrahigh vacuum.

The deceleration voltage is applied in order to give very low energy to the ions, close to zero and generally smaller than a few tens eV.

An important aspect of the treatment method according to the invention is that the ions do not contact the surface. On the contrary, they attract surface electrons, then flow away in the opposite direction.

Extracting electrons from a semiconductor by using highly charged ions with low energy is explained in the article by Jean-Pierre BRIAND presented at the Fourteenth International Conference of Accelerator Applications in Research and Industry, DENTON-Texas, 6–9$^{th}$ November 1996. Diagrammatically, a highly charged ion with low energy starts to interact with the semiconducting medium at quite a long distance from the surface, that can reach a few tens Angstroms. The ion attracts and then captures conduction or valence electrons that go through Rydberg conditions. The ion thus becomes a hollow atom, i.e. an atom with internal layers, which are at least partially empty, and with external layers made by energised electrons. The number of electrons captured by the ion is considerably higher than its charge, since a portion of these electrons are then expelled from the ion by Auger effect. The number of electrons removed from the semiconductor by a single ion is generally equal to approx. three times its charge.

Close to the surface, the ion generates an electric image, which exerts an attraction force on the ion and thus tends to accelerate its movement toward the surface. However, the extraction of electrons by the ion creates, on semiconductors or on insulators, positive holes at the surface which compensate for this electric image. The hollow atom formed from the ion can be back scattered without making any contact above the surface, by 'trampoline effect'. The existence of contact and of ingress or not inside the semiconductor material depends on the initial cinematic conditions of the ion: above a critical speed, the ion directed toward the surface reaches and penetrates the semiconductor material in spite of the formation of positive holes. Conversely, the trampoline effect occurs below this critical speed. The critical speed has a value that depends on the extraction potential of the semiconductor material and on the initial charge of the positive ion.

Controlling the average speed of the ions using the deceleration voltage enables to trigger the trampoline effect and to give the ions controlled charge and energy.

Moreover, each ion extracts electrons from an elementary interaction zone whose surface is determined by the position and the speed of the ion. The determined zone toward which the ion beam is sent thus consists of the association of all the elementary interaction zones of the ions in the beam.

The electrons extracted from the surface of the semiconductor are essentially electrons associated with the external bonds of the first molecules. In their absence, the hydrogen atoms saturating the external bonds are reduced to protons that are not bound to the surface any longer. The external bonds then become pendant.

Etching the surface of the semiconductor can be perfectly controlled spatially, by controlled position of the ion beam enabling accurate selection of the etching zones. Preferably, etching takes place in successive stages, one zone after the other, while varying the position or the orientation of the beam or of the target. According to an embodiment, several beams are directed toward the surface simultaneously.

The treatment method according to the invention differs from the existing etching techniques by the absence of any contact between the ions of the beam and the surface of the material. By contrast to the method consisting in forming blisters by ion shocks, the topography of the surface is not modified but its conductivity is. Indeed, whereas the first molecules are semiconducting, the second molecules are insulating.

In the field of etching, the method according to the invention thus enables to generate insulating peaks in the order of one nanometer. Information storage capacities can thus be increased by $100^2$ even $1000^2$ with respect to existing techniques. Moreover, local control of the surface conductivity after etching is easy and quick, using a tunnel-effect microscope.

In the field of surface cleaning, the treatment method according to the invention enables to obtain an extremely clean and well-defined surface, made by the second molecules of the insulating compound.

According to a first embodiment of the treatment method of the invention, the zones cover the whole surface.

The treatment method then consists in modifying the semiconducting surface into an insulating surface and is used preferably within the scope of surface cleaning.

According to a second preferred embodiment of the treatment method of the invention, the zones delineate an insulating network etched at the surface of the semiconductor.

This network comprises the second formed molecules, adjacent the first molecules left in place. This second embodiment enables to etch the semiconductor.

Preferably (in both embodiments), after having formed the insulating compound in the zones, electric conductivity is controlled locally using a tunnel effect microscope.

This control offers necessary accuracy in view of the finesse of the treatment. The surface can be read electrically using the tip of a tunnel effect microscope scanning this surface. By 'local control', we mean permanently localised control, that can be applied by spatial scanning to any portion of the surface.

Advantageously, for prior preparation of the semiconductor surface from the oxidised condition of the surface, the method comprises the steps of:

dipping the semiconductor into a first hydrofluoric acid bath, then dipping the semiconductor into a second bath, composed of hydrofluoric acid and ammonium ions.

This prior step, which corresponds to the technique used by BELL TELEPHONIE Co., enables to switch from the oxidised condition of the surface implementing five to six oxygen atomic layers at the perfectly controlled surface with a single atomic layer of hydrogen atoms.

Advantageously, the product comprises oxygen saturating the pendant external bonds.

The second formed molecules thus exhibit electrical insulation properties and the semiconductor can be used as a substrate for controlled growth of additional layers from a first layer of the second molecules, for instance to manufacture an MOS transistor or a capacitor network by metal deposit.

It is then interesting to send the beam of ions under partial vacuum, so that oxygen saturating the pendant external bonds is sent jointly.

Thus, it is not necessary to provide a specific and independent step for sending the product since the latter is spontaneously available close to the surface in the form of oxygen. Partial vacuum can reach $10^{-9}$ Pa.

According to another embodiment for sending the product, the beam of ions is sent under very high vacuum so that oxygen does not saturate the pendant external bonds and then, after etching of the surface, the product carrying the atoms saturating the pendant external bonds is sent. This product can be nitrogen for example. The process operations according to the invention are made under ultrahigh vacuum, for example in the order of $10^{-9}$ Pa.

In a preferred embodiment of the method of the invention, the semiconductor is based on silicon.

The first molecules are then essentially SiH. The second molecules, for their own parts, are $SiO_2$ in case when the product brings atoms of oxygen and silicon nitride ($Si_3N_4$) in case when it brings atoms of nitrogen.

Preferably, electrons are extracted by the ions while measuring the X-rays emitted when the extracted electrons switch from one electronic layer to another electronic layer of the ions.

Indeed, the electrons captured by hollow atoms and non-expelled flow down toward deeper layers while causing the emission of X-rays. These phenomena are described in the article by Jean-Pierre BRIAND previously mentioned, as well as in an article by Jean-Pierre BRIAND et Coll., published in Images de la Physique, 1992, pages 58–62. In a simplified way, emission and detection of X rays take place as follows. Only the last X transitions emitted in the deep layers are observed, whereas the transitions in the higher layers exhibit lower energy and are immersed in the continuous background. The transitions measured are therefore preferably those toward the L and K layers. The gaps in the L and K layers are filled up gradually. In the treatment method according to the invention, the hollow atoms are formed in Rydberg conditions so that a very large number of steps are necessary to reach the deep layers. The L layer then exhibits a low filling speed with respect to that of the K layer so that a Kα-type X-ray is emitted as soon as an electron reaches the L layer.

Gradual filling of the L layer or more generally of internal layers is used advantageously for temporal measurement of events, by detection of emitted X-rays. Filling up the internal layers indeed generates temporal marks spaced by a few ten femto-seconds.

Advantageously, for controlling X-rays by measurement, deceleration voltage is caused to vary and the X-rays emitted are measured for several values of the deceleration voltage.

The purpose of the invention is also a device for treating a semiconductor surface, whereas this surface is made by the first molecules of the semiconductor with external bonds and hydrogen atoms saturate these bonds.

According to the invention, the treatment device comprises:
- a source of highly charged positive ions with low energy,
- means for applying an emission voltage extracting a beam of ions of the ion source and directing the said toward the surface,
- means for applying a deceleration voltage, arranged close to the surface in order to give the ions of the beam a controlled average speed, enabling the ions to extract electrons from several of the first molecules without contacting the surface and thus causing the first molecules to lose their hydrogen atoms and to make the corresponding external bonds pendant,
- a source of a product saturating the pendant external bonds in order to form second molecules of an insulating compound, whereas this source sends the product toward the surface further to a passage of the beam, and
- a device for depressurising the beam and the surface.

The treatment device according to the invention can be used for cleaning or for surface etching.

It enables to obtain an extremely clean and well-defined surface, covered with an insulating layer or an etching with an insulating pattern on a semiconductor background.

Preferably, the treatment device according to the invention comprises a tunnel effect microscope, performing local electrical conductivity control of the surface treated.

Preferably, the treatment device according to the invention comprises an instrument for measuring emitted X-rays, when electrons extracted from an electronic layer switch to another layer of these ions.

The invention also relates to a semiconductor with a surface in which an insulating network is etched. According to the invention, the insulating network is etched approx. one nanometer deep.

The method according to the invention provides a means to obtain such a nanocomponent.

Preferably, the surface after etching is covered with a conducting coating.

The invention will be illustrated and better understood using modes of implementation as well as embodiments of the invention given below with reference to the appended drawings, on which:

FIG. 1A shows a wafer of semiconductor designed for undergoing the surface treatment method according to the invention.

FIG. 1B shows the wafer of FIG. 1A after pre-treatment.

FIG. 1C shows the wafer of FIGS. 1A and 1B after application of a first embodiment of the treatment method according to the invention.

FIG. 1D shows the wafer of FIGS. 1A and 1B after application of a second embodiment of the treatment method according to the invention.

FIG. 2 is a flow chart of the various steps of the pre-treatment and of the treatment method according to the invention, enabling to switch from the wafer of FIG. 1A to that of FIG. 1C or 1D, passing through the wafer of FIG. 1B.

FIG. 4 represents the interaction of a highly charged positive ion with the wafer surface of FIG. 1B during application of the treatment method according to the invention.

Figure 3:
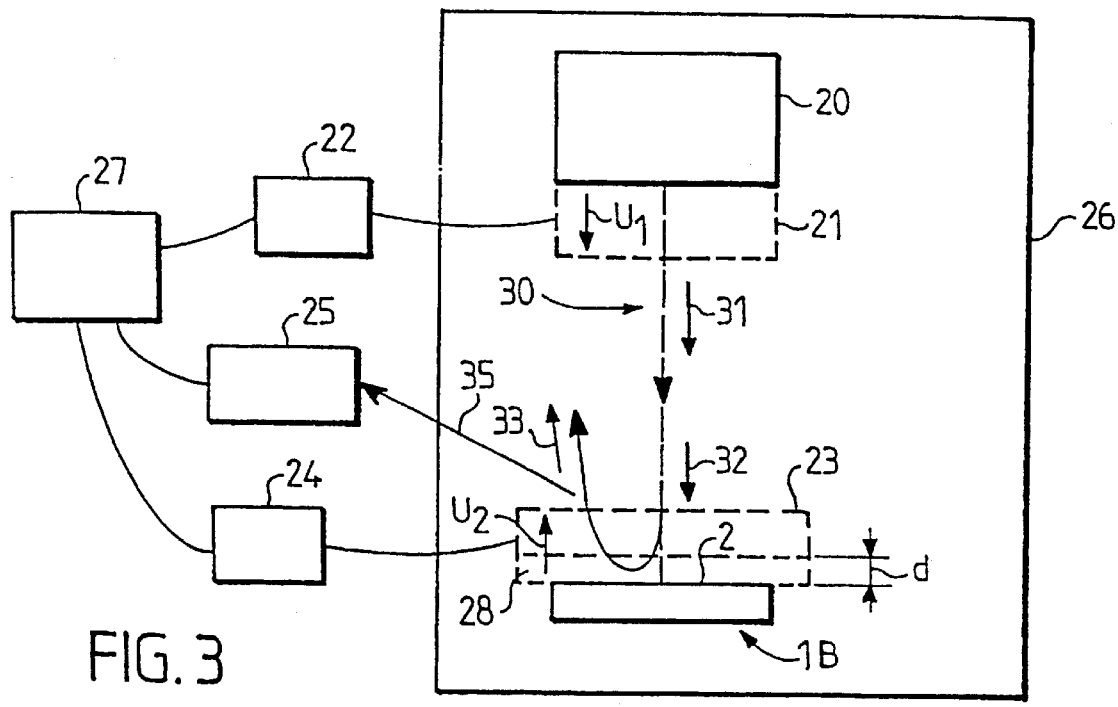
FIG. 3 is a diagrammatical embodiment of the treatment device according to the invention.

A semiconductor wafer 1, visible on FIG. 1A, is cut along a surface 2. The wafer 1 is formed for example of silicon, an advantageous example that we shall keep in the specification that follows. The semiconductor constituting the wafer 1 can be pure silicon or P or N doped silicon with various concentrations, whereas the doping concentration ranges advantageously between $10^{15}$ and $10^{18}$ atoms implanted per $cm^3$.

The surface 2 has an oxidised condition, due to air exposition of the wafer 1. Since the semiconductor is made of silicon, $SiO_2$ molecules are thus formed at the surface, over five to six atomic layers. By 'surface', we mean in fact a superficial portion of the wafer 1 with very small thickness e1 and made by the $SiO_2$ molecules. The thickness e1 is approximately 20 Angstroms.

The wafer 1 in this initial form 1A undergoes a pre-treatment enabling to etch the surface 2 and to cover it with a single layer of hydrogen. This pre-treatment comprises two steps 11 and 12, appearing on FIG. 2. According to the first step 11 of the pre-treatment, the wafer 1 is dipped into a first bath of hydrofluoric acid, then during the second step 12 of the pre-treatment, it is dipped into a second bath of hydrofluoric acid and comprising ammonium ions. Thus, the surface 2 is etched in order to eliminate the oxygen combined at the surface of the molecules of the semiconductor of the wafer 1. Pendant external bonds are thus created that can be saturated immediately with hydrogen.

The pre-treatment leads to a pre-treated condition 1B of the wafer 1 (FIGS. 1B and 2) in which the surface 2 is extremely well passivated and plane, and is made by SiH molecules on a thickness e2. The hydrogen atoms then make a single atomic layer above the wafer 1.

The wafer 1 is then subjected to a set of operations aiming at replacement of the SiH molecules, in whole or in part, of the surface 2 with $SiO_2$ molecules, while maintaining excellent definition and extreme cleanliness of the surface 2. Two embodiments can be distinguished. In the first, the hydrogen making external bonds is replaced by oxygen over the whole surface 2. A condition 1C of the wafer (FIG. 1C) can be obtained in which the superficial $SiO_2$ molecules cover a thickness e3 involving a single atomic layer, hence substantially smaller than e1. Switching from condition 1A to condition 1C of the wafer 1 thus constitutes excellent surface cleanliness, while keeping good surface evenness at atomic scale, failing any contact.

In the second embodiment, the atoms H saturating the external bonds of the surface 2 are replaced selectively with determined zones. The wafer 1 is thus etched, as can be seen on FIG. 1D. For this etching, since these determined zones of the surface 2 are made by insulating $SiO_2$ peaks, they form a network composed of insulating parts 5, whereas the complementary zones of the surface 2 remain made by SiH molecules.

The treatment operations leading to the wafer 1C or 1D are similar and differ essentially by the extent of the zone treated. They will therefore be described jointly for both embodiments.

To apply these operations, a surface treatment device represented on FIG. 3 is used. This device comprises an ion source 20 generating highly charged positive ions with low energy. The ion source 20 may use a preparation of the ions inside very hot plasma confined within magnetic structures, such as an ECR source (Electron Cyclotron Resonance). Its operating principle can also be compression of electron beams in a solenoid, whereas atoms injected into the electron beam are ionised and trapped by space charge simultaneously. The ion source 20 can thus be of EBIS-type (Electron Beam Ion Source).

The ions emitted by the ion source 20 can be for example argon, $Ar^{17+}$ or $Ar^{18+}$ or uranium. The number of positive charges can vary from a few units to 92 for uranium.

The treatment device also comprises first means of application 22 of an emission voltage $U_1$ in a zone 21 adjacent to the ion source 20, extracting ions from this ion source 20. The first means of application 22 thus generate a beam 30 of ions, which they direct toward the surface 2 of the wafer 1 along a controlled direction 31.

The treatment device also comprises second means of application 24 for a deceleration voltage $U_2$ in a zone 23 close to the surface 2. The second means of application 24 decelerate the ions of the beam 30 sufficiently so that the latter extract electrons from the surface 2 without making contact with the said surface and are back scattered in the form of hollow atoms and ions. As the ions emitted by the ion source 20 have an energy of several keV/q, for example ranging between 5 and 20 keV/q, whereas q designates the number of positive charges of each ion, the second means of application 24 give the ions an energy ranging between zero and a few eV/q in a controlled way. These second means of application 24 may comprise a plane capacitor with a potentiometer. Controlling the deceleration voltage $U_2$ enables to control the approach distance of each ion with respect to the surface 2 and hence the size of the elementary interaction zone which is etched by this ion.

The means of application 22 and 24 of the voltages $U_1$ and $U_2$ enable to orient the ion beam 30 accurately toward a determined zone of the surface 2. Preferably, they enable to ensure greatest possible guiding accuracy of the ions.

The treatment device comprises preferably an instrument 25 for measuring emitted X-rays when electrons extracted from the surface 2 by ions of the beam 30 switch from one electronic layer to another of these ions.

The ion beam 30 emitted by the ion source 20 and the surface 2 of the wafer 1 are protected from room atmosphere by a depressurisation casing 26.

The treatment device also comprises, advantageously, a treatment unit 27 connected to the ion source 20, using means of application 22 and 24 and to the measuring instrument 25, enabling to command and to control all these operations.

A tunnel effect microscope, performing local electrical conductivity control of the treated surface 2 preferably complements the treatment device.

In operation, the following steps are performed in succession when treating the surface (FIG. 2). The method consists, in a first step 13, in producing highly charged positive ions with low energy using the ion source 20, in a second step 14, in sending a beam 30 of ions toward the surface 2, using the means of application 22 of the emission voltage $U_1$. The beam then follows the direction 31. In a third step 15, the beam 30 is applied the deceleration voltage $U_2$ close to the surface 2, using the means of application 24. The ions of the beam 30 are then given a controlled average speed into a direction 32.

When the ions of the beam 30 are sufficiently close to the surface 2, they start to interact with the said surface. Above the surface 2, a capture zone 28 is delineated, in which the ions of the beam 30 can capture electrons of the wafer 1. This zone 28 extends up to a distance d above the surface 2. Thus, as soon as an ion 40 enters the zone 28, it interacts with a portion 42 of this surface 2 delineating approximately a disk of diameter D with contours at a distance d from the ion 40, as represented on FIG. 4. The diameter D of the interaction portion 42 does not exceed therefore 2d. The ion 40 thus attracts and extracts superficial electrons of the portion 42 all along its approach in the extraction zone 28. This approach is controlled by adjusting the kinetic energy of the ion 40 thanks to the means of application 24. The ion 40 captures electrons, which transform the said ion into a hollow atom.

This hollow atom is then back scattered without making contact by trampoline effect. Indeed, the positive holes formed in the portion 42 of the surface 2 push against the hollow atom made from the ion 40, whereas this hollow atom keeps a positive charge. The beam 30 of ions is thus sent back into a direction opposite to the surface 2 in a set of directions 33.

Preferably, the incidence of the beam 30 on the surface 2 is normal, whereas the position of the beam 30 is controlled by the means of application 22 and 24.

As the electrons are captured by the ions of the beam 30, the emitted X-rays when the extracted electrons switch from one electronic layer to another of the ions, are measured advantageously using the measuring instrument 25. Thus, the extraction process of the electrons is controlled in real time.

Figure 6:
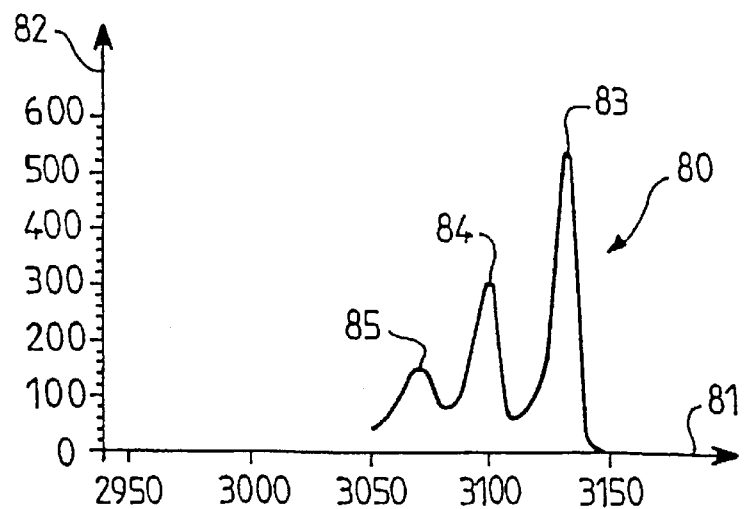
FIG. 6 represents a spectrum of X-rays measured during application to the wafer 1B of the treatment process according to the invention, whereas this spectrum is expressed in counting units in relation to energy.

For exemplification purposes, the ion source 20 is an ECR source producing ions $Ar^{17+}$ with 11 keV/q energy. The wafer 1B is an SiH wafer whose surface 2 is an Si plane 111 passivated by a single hydrogen layer. The interaction distance is then approx. 20 Angstroms. The beam 30 of the ions is sent toward the surface 2 in normal incidence and the ions are decelerated down to an adjustable energy range between 0 and 12 eV/q. When the ions interact at 1 eV/q energy with the surface 2, a spectrum 80 of K-type X-rays can be observed, plotted on FIG. 6 along an energy axis 81 in eV and an axis of counting units 82. This spectrum 80 puts essentially in evidence three satellite rays 83–85 that correspond respectively to the satellites $KL^1$, $KL^2$ and $KL^3$. The distribution of the rays is highly peaked on the ray 83 associated with the satellite $KL^1$.

Figure 5:
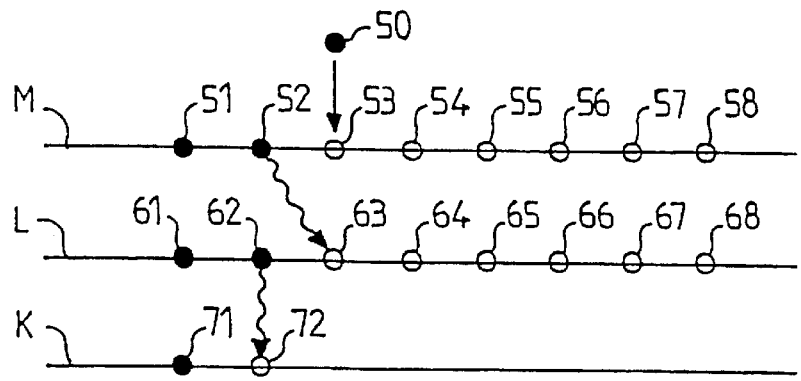
FIG. 5 illustrates electronic transitions with emission of X-rays in the deep layers of a hollow atom, during application of the wafer of FIG. 1B of the treatment method according to the invention.

In a simplified manner, the following explanations can be given on the. spectrum 80 observed, with reference to FIG. 5. FIG. 5 represents electrons by full circles and the gaps by empty circles. The three innermost to atomic layers of an ion 40, capturing an electron 50, are called K; L and M. The layer K, the deepest one, comprises schematically two locations 71, 72 one of whose (71) is already made by an electron and the other (72) exhibits a gap. The second layer L and the third layer M comprise respectively eight locations 61–68 and 51–58, initially empty in the ion 40. When electrons are captured by the ion, a portion of these electrons descends toward the deepest layers following an Auger cascade. The hollow atom thus formed being in a Rydberg condition, the filling of the layer L is slow compared to the filling of the gap 72 of the layer K. The eight gaps corresponding respectively to the locations 61–68 of the layer L being filled up gradually, an X-ray is emitted corresponding to the filling up of the location 72 of the layer K at the beginning of this filling operation. We obtain, thus, the rays 83–85 associated with a number of spectator electrons on the layer L ranging between 1 and 3, spaced by approx. 25 eV. As the layer L is usually not so full when the location 72 of the layer K is being filled up, the distribution of the rays $KL^1 \ldots KL^8$ is concentrated on the first three rays 83–85 and is highly peaked on the first ray 83. Accurate measurement of the energy of the rays 83–85 indicates moreover the average number of electrons on the layer M, whereas this number is for example close to 1 or 2.

Besides, filling up the layer L plays the part of an hourglass, whereas an Auger electron is mainly emitted at each fill-up of one of the locations 61–68. For instance, the filling-up takes place with a $3.10^{-16}$ s period.

The extraction of electrons from the surface 2 causes the hydrogen atoms saturating the corresponding external bonds to disappear from this surface 2. These external bonds become thus pendant.

The position of the beam 30 and the deceleration voltage $U_2$ delineate an interaction zone in the surface 2, which is etched by the beam 30. This zone covers no more than a 2d-perimeter around the extent of the beam 30. Preferably, this extent is about one nanometer.

In a fourth operation 16 of the surface treatment, a product saturating. the pendant external bonds is sent to the etched zone, in order to form molecules of an insulating compound. A simple way to proceed consists in applying partial vacuum in the casing 26, approx. $10^{-9}$ Pa. Oxygen present in the casing 26 then saturates immediately the pendant bonds in order to form the insulating compound.

All the operations 13 to 16 are then repeated, while varying the orientation and/or the position of the beam 30 and/or of the target, and possibly the extent of the beam 30 and by controlling the energy of the ions of this beam 30 in the extraction zone 28. In the first embodiment of the treatment method of the invention, the whole surface 2 is scanned. We then obtain the condition 1C of the wafer 1. In the second embodiment of the treatment method according to the invention, conversely, the beam 30 is only made to scan the zones corresponding to determined insulating portions 5, by moving the said beam or the target. We thus obtain the condition 1D of the wafer 1.

According to an another embodiment, the inside of the casing 26 is kept under ultrahigh vacuum and all the zones foreseen in the surface 2 are etched without sending the product saturating the pendant external bonds. Once this etching completed, the product is sent over the whole surface 2 in order to saturate simultaneously the pendant external bonds of all the etched zones.

Preferably, during an additional step 17, local electrical conductivity control of the surface 2 of the wafer 1C or 1D is performed using a tunnel effect microscope.

In the embodiment described until now, steps 11 and 12 were subject to pre-treatment so that hydrogen atoms make a single atom layer above the wafer 1, whereas a portion of these hydrogen atoms was then replaced with oxygen, nitrogen or any other appropriate component during the steps 13 to 16. In a variation of this embodiment, the product saturating the pendant external bonds is sent during the operation 16 so as to form several layers of this appropriate component. Thus peaks ranging from one to several layers are produced, the number of layers being preferably smaller than 5. For example, pressure or partial injection of the saturating product can be controlled.

Thus, possible superficial deteriorations liable to attack one or several layers of the surface 2 are taken into account. The surface 2 obtained is, as in the embodiment with a single layer, extremely plane and well defined.

Eventually, in an advantageous embodiment, the surface 2 is coated with a conducting layer. This coating is preferably metallic, for the manufacture of an MOS transistor. In this embodiment, the treatment device comprises vacuum vaporisation means for the conducting material in the casing 26.

What is claimed is:

1. A method for treating a surface of a semiconductor, whereby the surface is made by first molecules of the semiconductor with external bonds and the bonds are saturated with hydrogen atoms, wherein the method comprises the steps of:
   generating positive ions each having at least three positive charges with low energy with respect to the MeV,
   sending under vacuum a beam made of the ions toward at least one zone of the surface, whereas the at least one zone covers a determined portion of the surface,
   applying to the beam a deceleration voltage close to the surface, in order to give the ions of the beam a controlled average speed, whereas the ions extract electrons of the first molecules of the at least one zone without contacting the surface, so that the first molecules lose their hydrogen atoms and that the corresponding external bonds become pendant, and
   sending toward the at least one zone a product saturating the pendant external bonds in order to form second molecules of an insulating compound.

2. A treatment method according to claim 1, wherein the at least one zone covers an entirety of the surface.

3. A treatment method according to claim 1, wherein the at least one zone delineates an insulating network etched at the surface of the semiconductor.

4. A semiconductor having a surface in which an insulating network is etched, wherein the insulating network is etched by the treatment method according to claim 3.

5. A semiconductor according to claim 4, wherein the surface after etching is covered with a conducting coating.

6. A treatment method according to claim 1, wherein after having formed the insulating compound in the at least one zone, local electrical conductivity control is carried out using a tunnel effect microscope.

7. A treatment method according to claim 1, wherein, in order to previously prepare the surface of the semiconductor from an oxidized condition of the surface, the method comprises the steps of:

dipping the semiconductor into a first fluorhydric acid bath, then dipping the semiconductor into a second bath, composed of fluorhydric and ammonium ions.

8. A treatment method according to claim 1, wherein the product comprises oxygen saturating the pendant external bonds.

9. A treatment method according to claim 8, wherein the beam of ions is sent under partial vacuum, so that oxygen saturating the pendant external bonds is sent jointly.

10. A treatment method according to claim 1, wherein the semiconductor is based on silicon.

11. A treatment method according to claim 1, wherein extraction of the electrons by ions is controlled by measuring emitted X-rays emitted when extracted electrons switch from one electronic layer to another layer of the ions.

12. A treatment method according to claim 11, wherein the deceleration voltage is caused to vary and the emitted X-rays are measured for several values of the deceleration voltage.

13. A treatment method according to claim 1, wherein the method further comprises a tunnel effect microscope, intended for preforming local electrical conductivity control of the treated surface.

14. A treatment method according to claim 13, wherein the method further comprises an instrument for measuring emitted X-rays when the electrons extracted from an electronic layer switch to another layer of the ions.

* * * * *